United States Patent [19]

Packard

[11] 4,034,181

[45] July 5, 1977

[54] ADHESIVE-FREE PROCESS FOR BONDING A SEMICONDUCTOR CRYSTAL TO AN ELECTRICALLY INSULATING, THERMALLY CONDUCTIVE STRATUM

[75] Inventor: James R. Packard, St. Paul, Minn.

[73] Assignee: Minnesota Mining and Manufacturing Company, St. Paul, Minn.

[22] Filed: Jan. 8, 1975

[21] Appl. No.: 539,503

Related U.S. Application Data

[63] Continuation-in-part of Ser. No. 281,969, Aug. 18, 1972, abandoned.

[52] U.S. Cl. .......................... 219/121 EM; 29/589; 219/121 L; 174/16 HS
[51] Int. Cl.[2] ........................................ B23K 15/00
[58] Field of Search ............. 219/121 EM, 121 EB, 219/121 LM, 121 L; 29/589, 470.9, 576 J; 148/DIG. 505; 174/15 HS

[56] References Cited

UNITED STATES PATENTS

| | | |
|---|---|---|
| 2,668,133 | 2/1954 | Brophy et al. .......... 219/121 EM X |
| 2,798,989 | 7/1957 | Welker ............................ 29/576 J |
| 2,968,723 | 1/1961 | Steigerwald ............ 219/121 EM X |
| 3,351,733 | 11/1967 | Tomono et al. ......... 219/121 EB X |
| 3,397,278 | 12/1967 | Pomerantz ..................... 29/470.9 X |
| 3,417,459 | 12/1968 | Pomerantz et al. ............. 29/589 X |
| 3,585,350 | 6/1971 | Voytko ...................... 219/121 LM |
| 3,768,157 | 10/1973 | Buie ........................... 219/121 LM |

Primary Examiner—E. A. Goldberg
Attorney, Agent, or Firm—Cruzan Alexander; Donald M. Sell; William B. Barte

[57] ABSTRACT

A broad silver coated direct band-gap semiconductor crystal is bonded to a sapphire face plate without using any adhesive by a process of positioning the crystal with a broad surface against the sapphire, and bombarding the crystal with an electron beam raster scanned over the breadth of the crystal until the crystal and sapphire become bonded together.

3 Claims, 9 Drawing Figures

ADHESIVE-FREE PROCESS FOR BONDING A SEMICONDUCTOR CRYSTAL TO AN ELECTRICALLY INSULATING, THERMALLY CONDUCTIVE STRATUM

CROSS REFERENCE TO RELATED APPLICATION

This application is a continuation-in-part of my copending application Ser. No. 281,969 filed Aug. 18, 1972, now abandoned.

BACKGROUND OF THE INVENTION

1. Field of Invention

The present invention generally pertains to electron beam lasers and is more specifically directed to bonding a semiconductor crystal to an electrically insulating, thermally conductive stratum for use in such lasers.

2. Description of the Prior Art

Electron beam lasers are described in U.S. Pat. Nos. 3,558,956, 3,602,838 and 3,757,250. A preferred electron beam laser includes a sealed evacuated tube; an electron gun within the tube for providing an electron beam; a light resonant cavity including a direct band-gap semiconductor crystal having a pair of broad optically smooth opposing major surfaces, and means for providing two almost totally reflective surfaces positioned for defining the cavity, with one reflective surface being more reflective than the other; and an electrically insulating, thermally conductive stratum bonded to one of the broad surfaces of the crystal for dissipating heat from the crystal. The cavity is positioned so that the crystal may be bombarded by the electron beam and thereby excited into stimulated emission for emitting coherent electromagnetic radiation from the crystal through the least reflective surface.

An electron beam laser may further include a deflection means for scanning the electron beam, wherein when one of the major broad crystal surfaces is scanned by the electron beam, coherent electromagnetic radiation is emitted in a pattern corresponding to said electron beam scan.

Sapphire is preferred as a stratum material because it is transparent to the produced electromagnetic radiation and because of its ability to dissipate from the crystal, the heat produced upon excitation, without distorting its shape or that of the crystal. Quartz, diamond or BeO may be used in lieu of sapphire.

Direct band gap semiconductors which may be used as the laser crystal include CdS, CdSe, $CdS_xSe_{(1-x)}$, ZnO and GaAs.

Silver is a commonly used reflective coating.

In some embodiments, the means for providing the reflective surfaces includes a reflective coating on at least one of the broad surfaces of the crystal, and the stratum is bonded to a reflectively coated crystal surface. In other embodiments the light resonant cavity includes the stratum, and the stratum is bonded to an uncoated crystl surface.

Certain difficulties have been encountered with various means which have been employed to bond the crystal to the stratum. One such bonding means is an adhesive layer uniformly applied between the crystal and the stratum. However, most adhesives which have been so applied do not form a satisfactory bond. Particularly unsatisfactory is the bond produced by a solvent based adhesive, since upon forming a very thin adhesive layer between crystal and stratum, the solvent becomes trapped in this layer, and forms gas products which are not conducive to good optical quality or good thermal conductivity. One adhesive which does provide an otherwise satisfactory bond, phenyl ether dicyanate resin, has such a high curing temperature, however, that the properties of the crystals are so affected during the curing of the adhesive that lack of uniform lasing over the breadth of the crystal surface may result after curing.

An adhesive free bonding process described in U.S. Pat. Nos. 3,397,278 and 3,417,459 also has been found unsatisfactory for bonding a crystal to a stratum for use in an electron beam laser. Attempts to bond direct band-gap semiconductor crystals to sapphire have not been successful. In order to achieve a bond between such semiconductor crystals and quartz by such a process it has been necessary to use such high temperatures that uniform laser emission over the breadth of the crystal surface could not be achieved after such bonding.

Summary of the Invention

According to the present invention an adhesive-free bond between the crystal and the electrically insulating thermally conductive stratum is effected without impairing the uniformity of the laser emission produced over the breadth of the crystal when subsequently scanned by the electron beam.

According to the present invention, the crystal is bonded to the stratum by a process, comprising positioning the crystal with a broad major surface against the stratum; and bombarding the crystal wth an electron beam raster which is scanned over the breadth of the crystal until the crystal and stratum become bonded together. During this process, the stratum is not externally heated and no pressure is applied to join the crystal to the stratum.

In practicing the present invention, it has been found that a bond is more readily formed when using thin crystals. To date, a sufficient bond has not been achieved when using cadmium sulfide crystals having a thickness in excess of approximately 60 micrometers in their thinnest dimension. The process of the present invention is particularly advantageous for bonding thin crystals, however, in that the crystal can readily be positioned on the stratum without disturbance from any outside forces which might tend to cause damage to a delicate thin crystal.

In some of the electron beam lasers produced by the process of the present invention, the adhesive-free bond has not been permanent. In some such lasers after extended use, the bond between the crystal and the stratum has begun to weaken at the edges of the crystal, presumably because the surfaces of the crystals are sometimes slightly rounded at the edges.

Brief Description of the Drawing

FIG. 2 is not drawn to scale.

Description of the Preferred Embodiment

Figure 1:
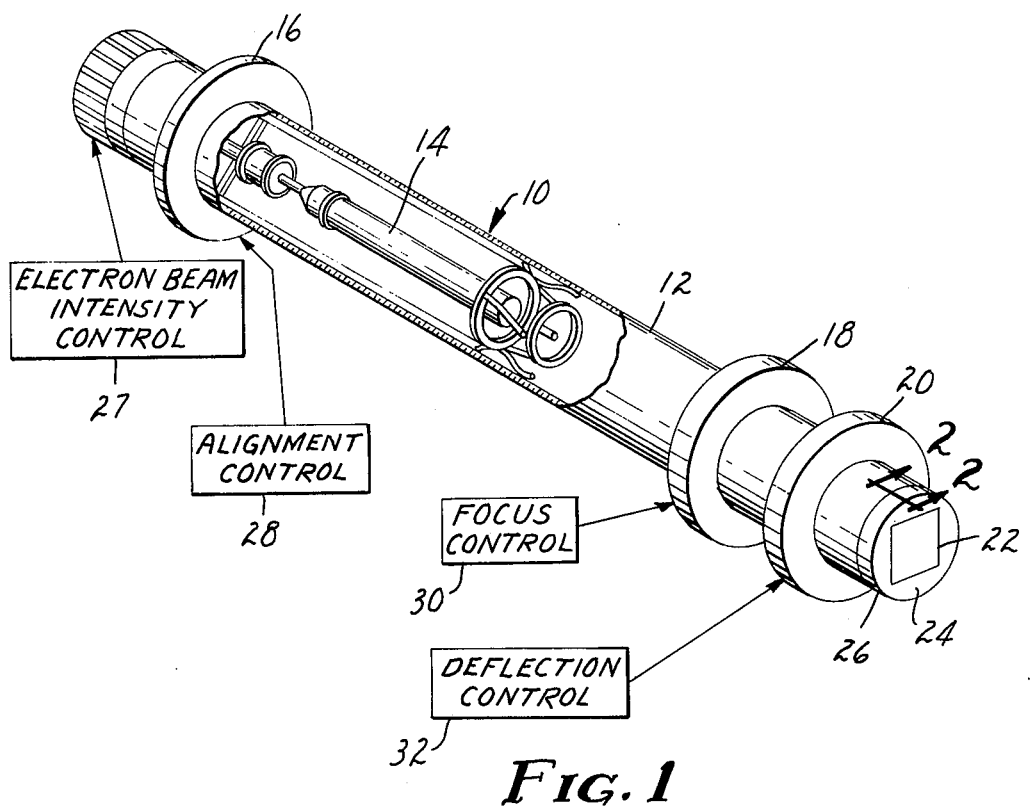
FIG. 1 is a perspective view of an electron beam leser produced according to the present invention.

An electron beam laser 10, as shown in FIG. 1, includes a sealed evacuated tube envelope 12 containing an electron gun 14, an alignment coil 16, a focus coil 18, a deflection coil 20 and a broad direct band-gap semiconductor crystal 22 bonded to the inside surface 23 of a transparent sapphire face plate (stratum) 24. Alternatively, the stratum 24 may be quartz.

Figure 2:
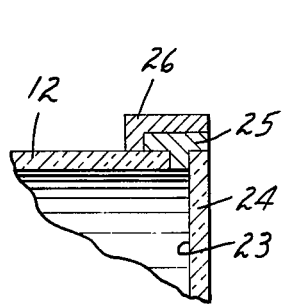
FIG. 2 is a sectional view of one corner of the face of the electron beam laser of FIG. 1 taken along sectional lines 2-13 2.

Referring to FIG. 2, the sapphire face plate 24 is secured to the glass tube envelope 12 by means of an indium ring 25 and a brass ring anode 26. The inside surface of this end of the glass tube envelope 12 is covered by a graphite coating which contacts the indium ring 25, which in turn contacts the brass ring anode 26. The graphite coating extends to also contact the anode clips of the electron gun 14.

An electron beam intensity control circuit 27, an alignment control circuit 28, a focus control circuit 30 and a deflection control circuit 32 are also included.

The light resonant cavity of the laser 10 includes a polished wafer of a single direct band-gap semiconductor crystal. Semiconductor materials which have been found to be suitable for this use include zinc oxide, cadmium sulfide, cadmium selenide, cadmium sulfur selenide and gallium arsenide. A crystal which will lase at room temperature is selected in accordance with the process described in British patent specification No. 1,267,374. The semiconductor crystal 22 is polished to provide two plano-parallel faces. The spacing between the two faces then determines the cavity thickness, which is on order of 10–50 $\mu$m. The two lateral broad dimensions of the cavity are about 25 mm. The crystal faces are mirrored such as by vapor coating with silver or aluminum in order to achieve a reflectivity of about 96% and about 92% on the bombarded and opposite crystal faces respectively. The crystal 22 may also be reflectively coated with a multiple layer dielectric such as a composition of alternate layers of cryolite and zinc sulfide.

The brass ring anode 26 is grounded when the laser 10 is installed for operation, and a negatively biased voltage source (not shown) is connected to the laser cathode contacts (not shown).

In operation, an electron beam generated by the electron gun 14 bombards the inside face of the crystal 22. The electron beam is focused such that the spot size is on the order of a diameter of about 25 $\mu$m. The electron beam energy is selected to be in a range between 20 keV and 50 keV. The current density is on the order of tens of amp/cm$^2$, and is in excess of the threshold level needed to excite stimulated emission in the crystal 22. A coherent electromagnetic radiation beam emerges through the opposite face of the crystal 22, at a location opposite to the location bombarded by the electron beam.

Deflection of the electron beam to any selected location on the broad bombarded surface of the crystal 22 thus results in the generation of a coherent light beam from a corresponding location on the broad opposite surface of the crystal 22. The electron beam is impinged upon the crystal 22 in a pulsed mode with a pulse width of between 50–100 nanoseconds. The rise time and decay time of the laser emission is on the order of a few nanoseconds. Thus, the laser light pulse generally corresponds to the electron beam pulse.

Figure 3:
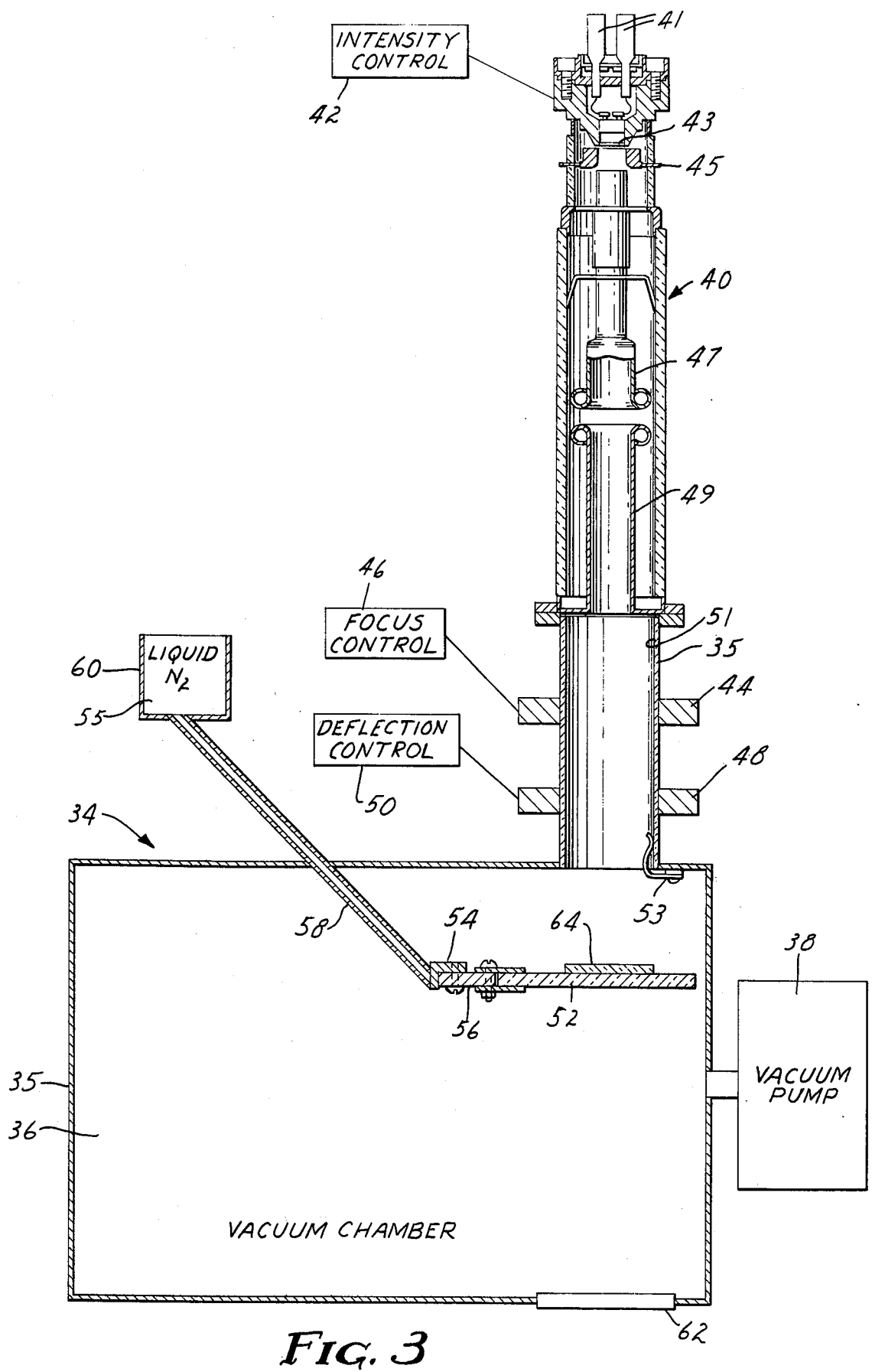
FIG. 3 is a schematic representation of an apparatus for accomplishing the process of bonding a crystal to stratum in accordance with the present invention.

The adhesive-free process of bonding a crystal 64 to a stratum 52 is accomplished through use of an apparatus 34 which is shown schematically in FIG. 3. This apparatus 34 includes a housing 35 defining vacuum chamber 36 which is evacuated by a vacuum pump 38.

An electron gun 40 is attached to the housing 35 so as to share the vacuum of the vacuum chamber 36. Electron beam intensity is modulated and controlled by an intensity control circuit 42. The elctron gun 40 is an RCA type VC2126 gun having cathode-filament terminals 41, three grids 43, 45 and 47 and an anode 49. The anode 49 is connected to ground potential by a graphite coating on the inside surface 51 of the housing 35, which is in turn electrically connected to the electrically grounded housing 35 by the connector 53. A potential of −40 KV is applied to the cathode terminals 41, and potentials of approximately −40.05 KV, −39.2 KV and −22 KV are applied to the grids 43, 45 and 47 respectively.

An electron beam provided by the electron gun 40 is focused by a focus coil 44 and a focus control circuit 46. The electron beam is deflected by a deflection coil 48 and a deflection control circuit 50.

A sapphire disk 52 is secured to a copper cold finger 54 by a copper clamping device 56. The cold finger 54 is cooled by liquid nitrogen 55 contained in a hollow stainless steel shaft 58 extending through the housing 35 into the chamber 36 from a vessel 60.

The housing 35 contains a window 62 for viewing the sapphire 52 and the crystal 64.

The bonding process preferably is conducted as follows: A sapphire 52 and a crystal 64 are both cleaned by swabbing with alcohol or trichlorolethylene. The sapphire 52 is secured to the cold finger 54. The crystal 64 is placed in a desired position on the sapphire 52. The vacuum chamber 36 is evacuated to a vacuum of less than 10$^{-5}$ Torr. The temperature of the cold finger is cooled to approximately 77° K. The electron gun 40 is then controlled to provide an electron beam raster which is scanned over the breadth of the crystal 64 until the crystal 64 and the sapphire 52 become bonded together.

The electron beam bombardment is controlled to prevent the temperature of the crystal from being so increased by the bombardment that uniformity of laser emission over the breadth of the crystal would be impaired. The electron beam is accelerated at an energy of approximately 40 keV. The electron beam is pulsed at a rate of approximately one pulse per 5 microseconds, with each pulse having a duration of approximately 50 nanoseconds. The electron beam is swept at a rate of approximately 100 meters per second.

For a crystal 64 approximately 1 inch (2.5 cm) square and 20 micrometers thick a 4 milliampere electron beam having a 50 micrometer cross sectional diameter is scanned for approximately 15 minutes in a raster containing approximately 125 lines of pulses. This bonding process may also be performed at room temperatures.

Under ambient light conditions, as the bonding process occurs the reflectivity at the interface between the crystal 64 and the stratum 52 decreases, thereby giving the crystal 64 a somewhat darker appearance as viewed through the window 62.

Although bonding may be achieved by this process whether or not the crystal 64 is reflectively coated prior to being bombarded by the electron beam, bonding is not achieved when the sapphire 52 is reflectively coated with a metal on the bonding surface prior to the bombarding step.

Figure 4A:
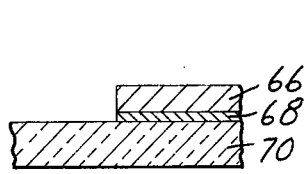
FIGS. 4A and 4B are partial sectional views of the combination of a crystal and a stratum during the bonding process stage and as included in an electron beam laser such as the laser of FIG. 1, respectively.
Figure 4B:
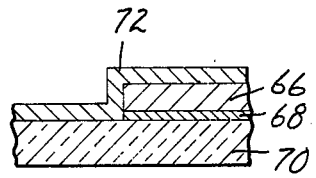
Figure 5A:
FIGS. 5A and 5B are views like those of FIGS. 4A and 4B, except for being of different embodiments of the present invention.
Figure 5B:
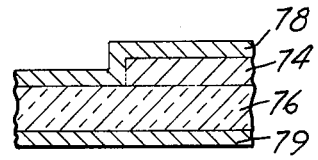
Figure 6A:
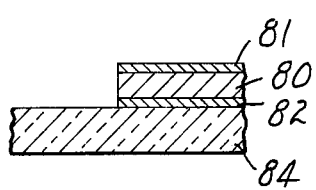
FIGS. 6A and 6B are views like those of FIGS. 4A and 4B, except for being of different embodiments of the present invention.
Figure 6B:
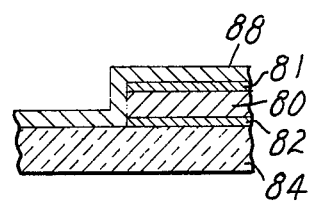

FIGS. 4A, 5A and 6A show three embodiments of the combination of a crystal 64 and a sapphire 52 during the bonding process, and FIGS. 4B, 5B and 6B respectively show three corresponding embodiments of this combination when fully reflectively coated and placed in an electron beam laser.

Referring to FIG. 4A, a crystal 66 having one reflectively coated side 68 is placed on a sapphire disk 70 with this side 68 in contact with the sapphire 70. The crystal 66 is then bombarded by an electron beam until bonded to the sapphire 70. Referring to FIG. 4B the bonded crystall 66 - sapphire 70 combination 71 is later coated with a metallic reflective layer 72. The metallic layer 72 makes electrical contact with the anode ring 26 when the combination 71 is installed in a laser 10 in order to bleed off to ground the charge produced by the electron beam in the laser 10.

Referring to FIG. 5A an uncoated crystal 74 is placed on a sapphire disk 76 and then bombarded by an electron beam until bonded to the sapphire 76. Referring to FIG. 5B the bonded crystal 74 - sapphire 76 combination 77 is later coated on both sides with reflective layers 78 and 79. At least the reflective layer 78 is metallic.

Referring to FIG. 6A a crystal 80 having reflective coatings on both sides 81 and 82 is placed on a sapphire disk 84 and then bombarded by an electron beam until bonded to the sapphire 84. Referring to FIG. 6B the bonded crystal 80 - sapphire 84 combination 86 is later coated with a thin metallic reflective layer 88.

What is claimed is:

1. An adhesive-free process for forming a light resonant cavity and transparent heat sink suitable for use in an electron beam laser consisting of the following steps:

providing a crystal of a direct band-gap semiconductor having two major broad and plano-parallel faces and a thickness therebetween not greater than approximately 60 micrometers, forming on a block of a thermally-conductive electrical insulator material selected of either quartz or sapphire a corresponding major broad and substantially planar surface, positioning a major broad surface of the crystal in contact with the major broad surface of the insulator material, bombarding the breadth of the opposite major broad surface of the crystal with a swept and pulsed electron beam for a total duration of approximately 15 minutes, said beam having an energy of approximately 40 keV, a beam current of approximately 4 ma and a beam diameter of approximately 50 $\mu$m, being swept at a rate of approximately 100 meters/sec over a raster containing approximately 125 lines and being pulsed at a rate of approximately one pulse every 5 microseconds, with each pulse lasting approximately 50 nanoseconds to allow heat produced at a given location in the crystal as the result of a given pulse to be dissipated into the crystal and insulating material during the period between pulses and during the period while the beam is scanned over the remainder of the crystal to avoid appreciable increases in the bulk temperature of the crystal and to ensure that the uniformity of laser characteristics of the crystal are not impaired, a uniform bond thereby being produced over substantially the entire area of the contacted surfaces of the crystal and insulator material without the application of external heat or pressure such that when the bonded crystal and insulator material are utilized in a said electron beam laser, heat generated as a result of electron bombardment during the laser emission is dissipated into the heat sink, enabling the lasing crystal to be in thermal equilibrium such that lasing threshold and wavelength of laser emission is the same over all portions of the crystal.

2. A process according to claim 1, wherein a crystal is selected from the group consisting of CdS, CdSe, $CdS_x$, $Se_{(1-x)}$, ZnO and GaAs.

3. A process according to claim 1, wherein one or both of said major broad surfaces of said crystal are reflectively coated prior to positioning one of the surfaces in contact with the insulator material.

* * * * *

UNITED STATES PATENT AND TRADEMARK OFFICE
CERTIFICATE OF CORRECTION

PATENT NO. : 4,034,181
DATED : July 5, 1977
INVENTOR(S) : James R. Packard

It is certified that error appears in the above-identified patent and that said Letters Patent are hereby corrected as shown below:

Column 2, line 59, change "leser" to -- laser --;

and line 63, change "2-13 2" to -- 2-2 --.

Signed and Sealed this

Twenty-fifth Day of October 1977

[SEAL]

Attest:

RUTH C. MASON
*Attesting Officer*

LUTRELLE F. PARKER
*Acting Commissioner of Patents and Trademarks*